US007570098B2

(12) United States Patent
Ting

(10) Patent No.: US 7,570,098 B2
(45) Date of Patent: Aug. 4, 2009

(54) ACTIVE VOLTAGE-CLAMPING GATE DRIVING CIRCUIT

(75) Inventor: Ming-Chiang Ting, Hsinchu (TW)

(73) Assignee: Niko Semiconductor Co., Ltd. (TW)

( * ) Notice: Subject to any disclaimer, the term of this patent is extended or adjusted under 35 U.S.C. 154(b) by 57 days.

(21) Appl. No.: 11/862,317

(22) Filed: Sep. 27, 2007

(65) Prior Publication Data

US 2009/0085633 A1 Apr. 2, 2009

(51) Int. Cl.
*H03K 5/08* (2006.01)

(52) U.S. Cl. ...................................... 327/323; 327/427

(58) Field of Classification Search ................. 327/309, 327/315, 316, 318, 319, 321, 322, 323, 327, 327/328, 427

See application file for complete search history.

(56) References Cited

U.S. PATENT DOCUMENTS 5,625,312 A * 4/1997 Kawakami et al. .......... 327/483
6,057,728 A * 5/2000 Igarashi ...................... 327/546
6,545,513 B2 * 4/2003 Tsuchida et al. ............ 327/108
6,720,819 B1 * 4/2004 Yamamoto .................. 327/427

* cited by examiner

*Primary Examiner*—Jeffrey S Zweizig
(74) *Attorney, Agent, or Firm*—Schmeiser, Olsen & Watts

(57) ABSTRACT

An active voltage-clamping gate driving circuit comprises a difference comparison circuit for receiving a reference voltage, a gate driving signal, and a preset voltage level, and outputting a voltage comparison signal; and a gate driving circuit for receiving an input signal and the voltage comparison signal, and outputting a gate driving signal. The voltage comparison signal controls the gate driving circuit. When a level difference between the gate control signal and the reference voltage is equal to the preset voltage level, the gate driving circuit is turned off, so that the level of the gate control signal is clamped to the preset voltage level, and the gate driving circuit does not output quiescent direct current under the clamped state.

13 Claims, 15 Drawing Sheets

ACTIVE VOLTAGE-CLAMPING GATE DRIVING CIRCUIT

FIELD OF THE INVENTION

The present invention relates to a gate driving circuit, and more particularly to a gate driving circuit capable of clamping an output voltage level thereof.

BACKGROUND OF THE INVENTION

A driving signal having an overly high level output by a gate driving circuit would cause breakdown of gate oxide layers of a field effect transistor (FET). Therefore, the protection of the gate oxide layers of a driven element against breakdown must be taken into consideration when designing a gate driving circuit. Generally, a Zener diode or a linear regulator is applied to provide required clamping voltage level and electric current.

FIG. 1 shows a circuit 10 in which a Zener diode 12 is used to drive a p-type power transistor 13 so as to achieve the purpose of voltage clamping. In the circuit 10, a difference between an output voltage VOUT and a supply voltage VDD is limited to a breakdown voltage of the Zener diode, so as to achieve the output voltage clamping effect. However, since the Zener diode operates within a breakdown region when clamping the output voltage VOUT, there is direct current flowing through the Zener diode, and accordingly, relatively higher power consumption.

FIG. 2 show a circuit 20 in which a linear regulator 22 is used to drive a p-type power transistor 24 so as to achieve the purpose of voltage clamping. In the circuit 20, a negative feedback is utilized to lock a difference between the output voltage VOUT and the supply voltage VDD to a preset voltage level, so as to achieve the output voltage clamping effect. However, there is a preset voltage drop in the linear regulator 22, and therefore there is a quiescent direct current. In addition, the linear regulator 22 also has to provide high-speed transient current needed by gate signal level translation. Therefore, in this conventional way of voltage clamping, a large-area voltage-stabilizing capacitor 23 is required to stabilize the output voltage VOUT. As a result, a large chip area is occupied and an increased cost is required.

SUMMARY OF THE INVENTION

It is therefore a primary object of the present invention to provide an active voltage-clamping gate driving circuit that utilizes simple output detection feedback to achieve the purpose of output voltage clamping and low power consumption.

To achieve the above and other objects, the active voltage-clamping gate driving circuit according to the present invention includes a difference comparison circuit and a gate driving circuit. The difference comparison circuit receives a reference voltage and a gate control signal, and outputs a voltage comparison signal according to the received reference voltage and gate control signal. The gate driving circuit receives an input signal and the voltage comparison signal output by the difference comparison circuit, and outputs a gate driving signal. Wherein, when a level difference between the gate control signal level and the reference voltage level is substantially equal to (larger than or smaller than) a preset value, the voltage comparison signal controls the gate driving circuit to turn off, so that the level of the gate control signal is clamped to the preset voltage level.

The present invention also provides another type of active voltage-clamping gate driving circuit, which includes a difference comparison circuit and a gate driving circuit. The difference comparison circuit receives a reference voltage, a preset voltage level, and a gate control signal, and outputs a voltage comparison signal according to the received reference voltage, present voltage level, and gate control signal. The gate driving circuit receives an input signal and the voltage comparison signal output by the difference comparison circuit, and outputs a gate driving signal. Wherein, when a level difference between the gate control signal and the reference voltage is substantially equal to (larger than or smaller than) the preset voltage level, the voltage comparison signal controls the gate driving circuit to turn off, so that the level of the gate control signal is clamped to the preset voltage level.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

An active voltage-clamping gate driving circuit according to the present invention will now be described in details with reference to the accompanying drawings.

According to an essential of the present invention, detection is conducted to verify whether the gate driving signal has reached a preset output level while a gate driving signal causes a driven element to an ON state. When the gate driving signal has reached the preset output level, the gate driving circuit is turned off to clamp the gate driving signal at the preset output level. In this manner, the problems of existence of direct current and high power consumption as found in the prior art voltage clamping techniques are overcome.

Figure 1:
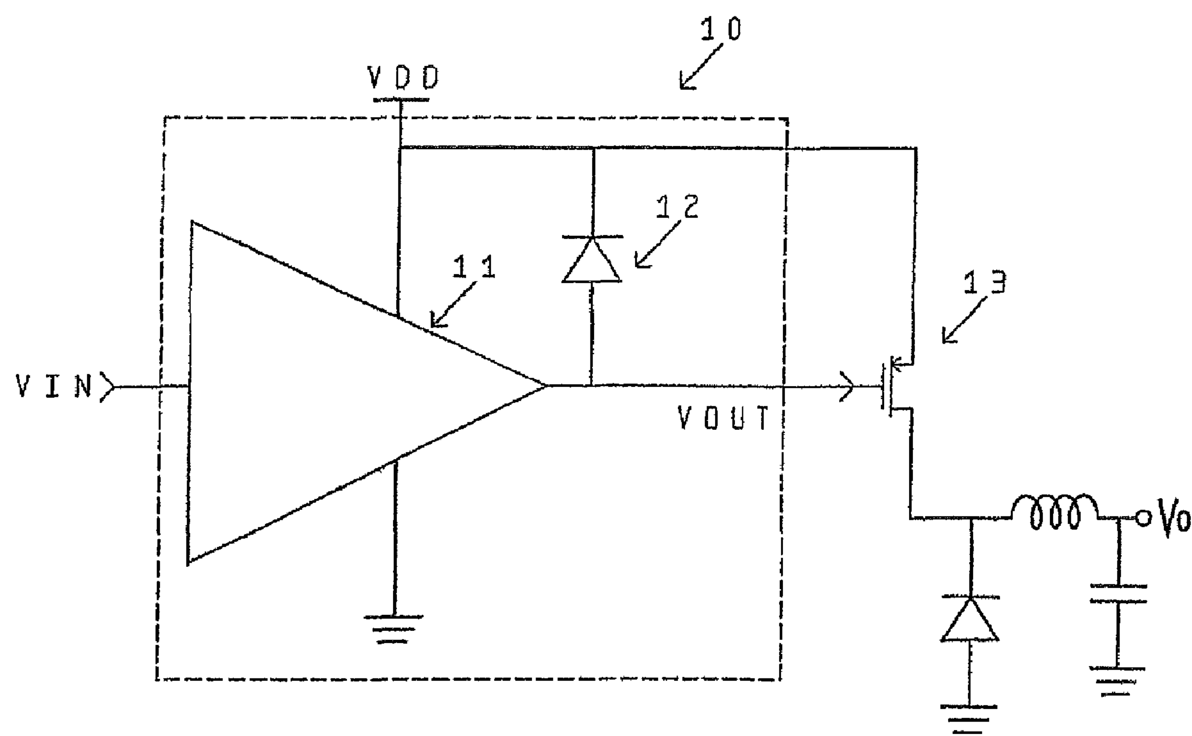
FIG. 1 is a circuit diagram showing the use of a Zener diode in driving a p-type power transistor to achieve voltage clamping in the prior art.
Figure 2:
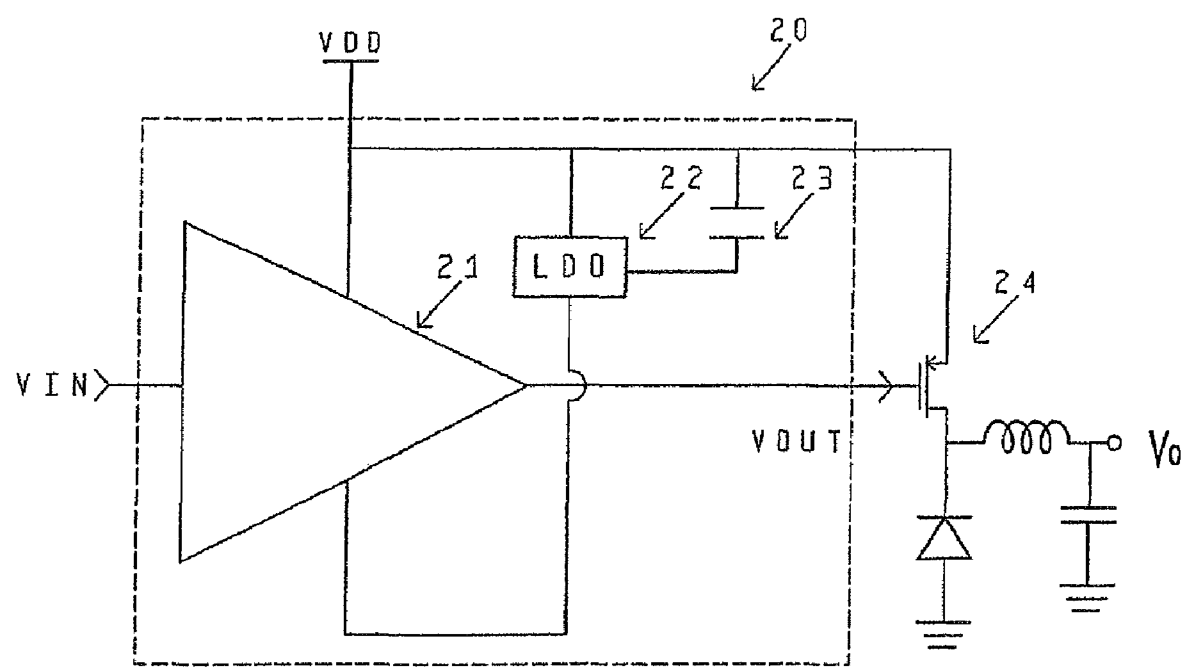
FIG. 2 is a circuit diagram showing the use of a linear regulator in driving a p-type power transistor to achieve voltage clamping in the prior art.
Figure 3:
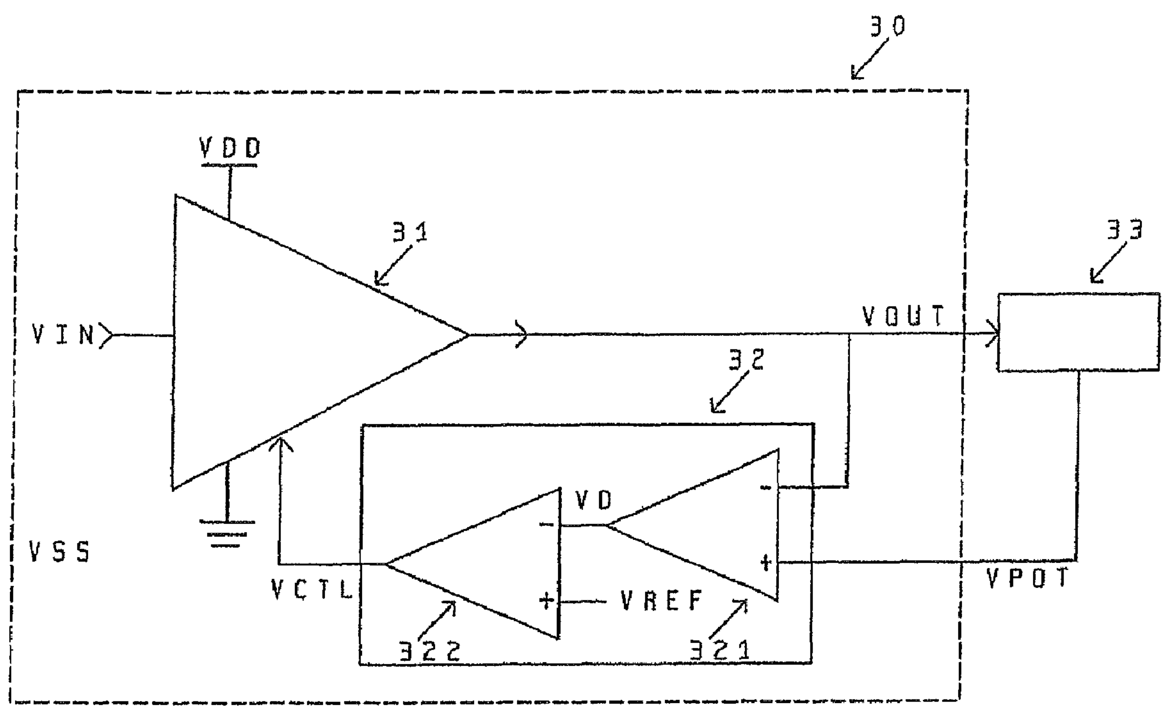
FIG. 3 shows an active voltage-clamping gate driving circuit of the present invention comprising a gate driving circuit and a difference comparison circuit.

Please refer to FIG. 3 that shows an active voltage-clamping gate driving circuit 30 according to the present invention. As shown, the active voltage-clamping gate driving circuit 30 comprises a gate driving circuit 31 and a difference comparison circuit 32. The gate driving circuit 31 provides a gate driving signal VOUT according to an input signal VIN, so as to drive a driven element 33. Wherein, a reference voltage VPOT is used as a reference voltage of the driven element 33. According to the reference voltage VPOT and the gate driving signal VOUT, the difference comparison circuit 32 generates a control signal VCTL for controlling the gate driving circuit 31. Wherein, the difference comparison circuit 32 comprises an error amplifier 321 and a comparison circuit 322. The error amplifier 321 generates a voltage difference signal VD according to the reference voltage VPOT and the gate driving signal VOUT. The voltage difference signal VD is then compared with a preset reference level VREF by the comparison circuit 322 to generate the control signal VCTL for controlling the gate driving circuit 31. When a difference between the voltage difference signal VD and the preset reference level VREF reaches a preset value, that is, when a voltage difference between the reference voltage VPOT and the gate driving signal VOUT reaches the preset reference level VREF, the comparison circuit 322 generates the control signal VCTL to turn off the gate driving circuit 31. At this point, the gate driving circuit 31 is turned off and thereby maintains the level of the gate driving signal VOUT. In this manner, the voltage level of the gate driving signal VOUT is clamped without the existence of quiescent direct current to achieve the purpose of low power consumption.

The reference voltage VPOT is used to determine whether the gate driving signal VOUT is lower than a reference voltage level (in the case of a p-type transistor or using other different reference voltage VPOT), higher than a reference voltage level (in the case of an n-type transistor or using other different reference voltage VPOT), or substantially equal to a reference voltage level (when determined via the above-mentioned comparison or an edge-triggered manner). When the above-described condition is reached, the difference comparison circuit 32 outputs the control signal VCTL to turn off the gate driving circuit 31. The reference voltage VPOT may be a supply voltage VDD, a circuit common ground VSS, or a drain voltage or a source voltage of the driven element 33. When the driven element is in an ON state, the drain voltage thereof is substantially equivalent to the supply voltage VDD (e.g., PMOS) or a ground voltage (e.g., NMOS). The source voltage of the driven element 33 is also the supply voltage VDD (e.g., PMOS) or the circuit common ground VSS (e.g., NMOS). In this case, a user needs only to adjust the preset reference level VREF to achieve the above-mentioned objects of the present invention.

Figure 4:
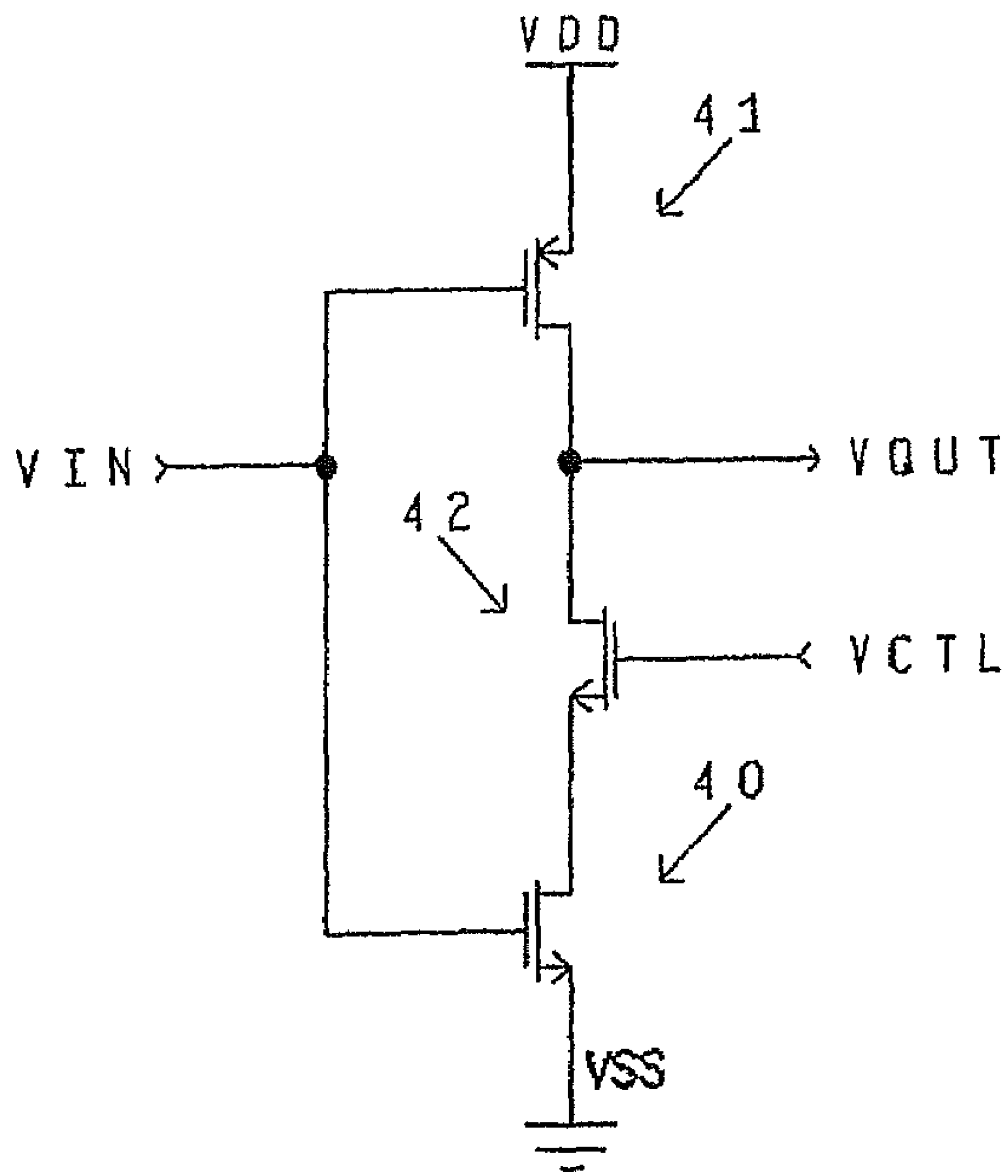
FIG. 4 shows a first embodiment of the gate driving circuit shown in FIG. 3.

FIG. 4 is a circuit diagram of a first embodiment of the gate driving circuit 31 shown in FIG. 3. According to the input signal VIN, the gate driving circuit 31 reversely outputs the gate driving signal VOUT and uses the same to drive a p-type power transistor. In this embodiment, a main driving stage comprises two transistors 40, 41 and reversely outputs the gate driving signal VOUT according to the input signal VIN. A transistor 42 forms a control stage, and so the gate driving circuit 31 is controller by the control signal VCTL. Please refer to FIGS. 3 and 4 at the same time. When the input signal VIN is logic low, the transistor 41 is turned on and the transistor 40 is turned off and therefore, the gate driving signal VOUT is logic high. At this point, the voltage difference signal VD output by the error amplifier 321 is a low level, smaller than the preset reference level VREF and therefore, the control signal VCTL is logic high. When the control signal VCTL is logic high, the main driving stage operates normally to reversely output the gate driving signal VOUT according to the input signal VIN. When the input signal VIN is logic high, the transistor 41 is turned off and the transistor 40 is turned on and therefore, the gate driving signal VOUT begins to turn into logic low. When the gate driving signal VOUT has become lower than the reference voltage VPOT and brings the voltage difference signal VD to be larger than the preset reference level VREF, the control signal VCTL turns into logic low. As described above, when the input signal VIN is logic high, the transistor 41 is turned off. At this point, when the control signal VCTL is logic low, the transistor 42 is also turned off. Therefore, the gate driving circuit 31 stops charging and discharging a gate parasitic capacitor of the driven element 33. In this manner, the gate driving signal VOUT can be held at (i.e. clamped to) a preset driving level to avoid a breakdown of the driven element 33, and to reduce the power consumption due to direct current output at the clamping as would be found in the prior art.

Figure 5:
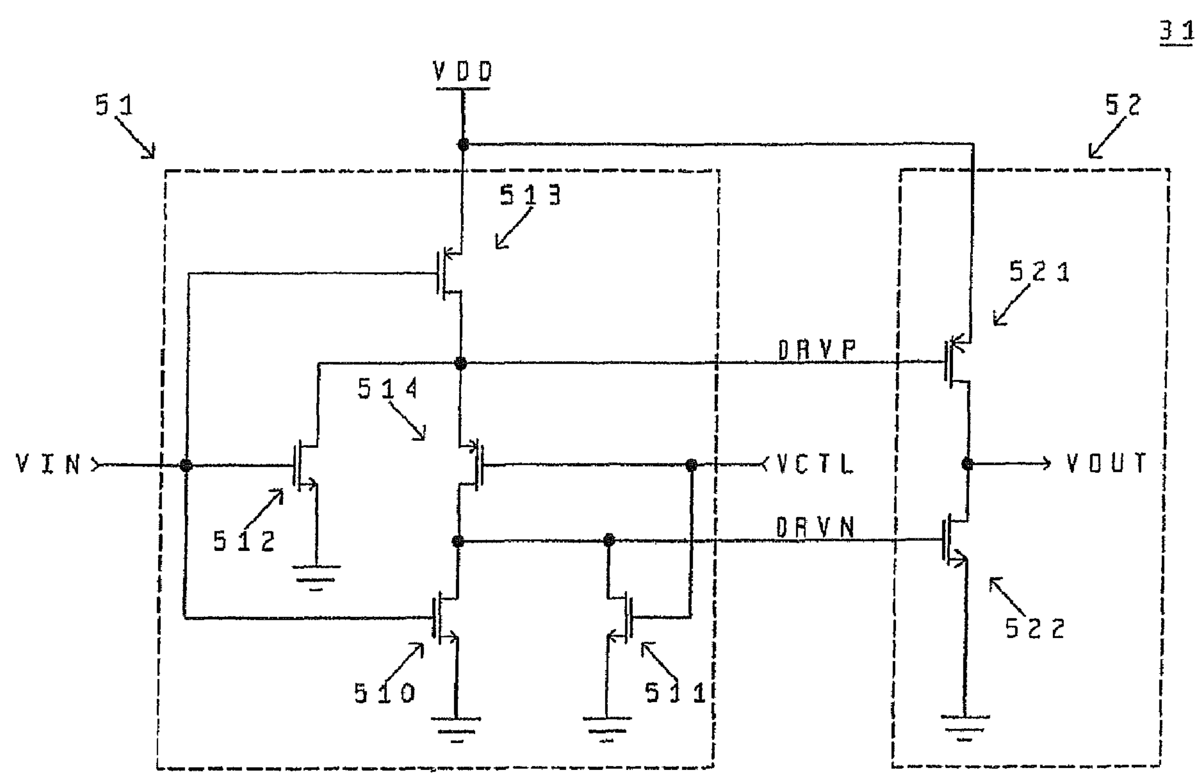
FIG. 5 shows a second embodiment of the gate driving circuit shown in FIG. 3.

FIG. 5 is a circuit diagram of a second embodiment of the gate driving circuit 31 shown in FIG. 3. According to the input signal VIN, the gate driving circuit 31 non-reversely outputs the gate driving signal VOUT and uses the same to drive a p-type power transistor. In this embodiment, a first driving circuit 51 comprises a main driving stage of transistors 510, 512, 513 and a control stage of transistors 511, 514. A second driving circuit 52 comprises transistor 521, 522. In the second driving circuit 52, the transistor 521 receives a driving signal DRVP generated by the first driving circuit 51, and the transistor 522 receives a driving signal DRVN generated by the first driving circuit 51. The transistors 521, 522 of the second driving circuit 52 together generate the gate driving signal VOUT according to the driving signal DRVP and the driving signal DRVN. When the input signal VIN is logic high, the transistors 521, 522 output logic high of gate driving signal VOUT, bringing the driven element to the OFF state. At this point, when the control signal VCTL is logic low, the gate driving circuit 31 operates normally. At this point, the driving signals DRVP, DRVN generated by the first driving circuit 51 are directly controlled by the input signal VIN to drive the second driving circuit 52. Therefore, the gate driving signal VOUT is non-reversely output according to the input signal VIN. When the input signal VIN is logic low, the gate driving signal VOUT is logic low and brings the driven element to be ON. When the gate driving signal VOUT is lower than a preset level, the difference comparison circuit 32 would output a control signal VCTL of logic high representing "OFF". Since the control signal VCTL is logic high, the driving signal DRVN of the first driving circuit 51 is logic low due to the ON state of the transistor 511, bringing the transistor 522 of the second driving circuit 52 to be OFF. On the other hand, the driving signal DRVP of the first driving circuit 51 is directly controlled by the input signal VIN due to the OFF state of the transistor 514. At this point, the input signal VIN is logic low and the driving signal DRVP is logic high, bringing the transistor 521 of the second driving circuit 52 to be OFF, too. Since both of the transistors 521, 522 of the second driving circuit 52 are OFF, they stop charging and discharging the gate parasitic capacitor of the driven element 33. In this manner, the gate driving signal VOUT can be held at (i.e. clamped to) a preset driving level.

While the p-type power transistor is subject to breakdown due to an overly low gate driving signal VOUT, the n-type power transistor is subject to breakdown due to an overly high gate driving signal VOUT. The following embodiments of the gate driving circuit 31 is used to driving an n-type power transistor, and is able to provide the function of clamping the voltage level of a gate driving signal VOUT via control of a control signal VCTL.

Figure 6:
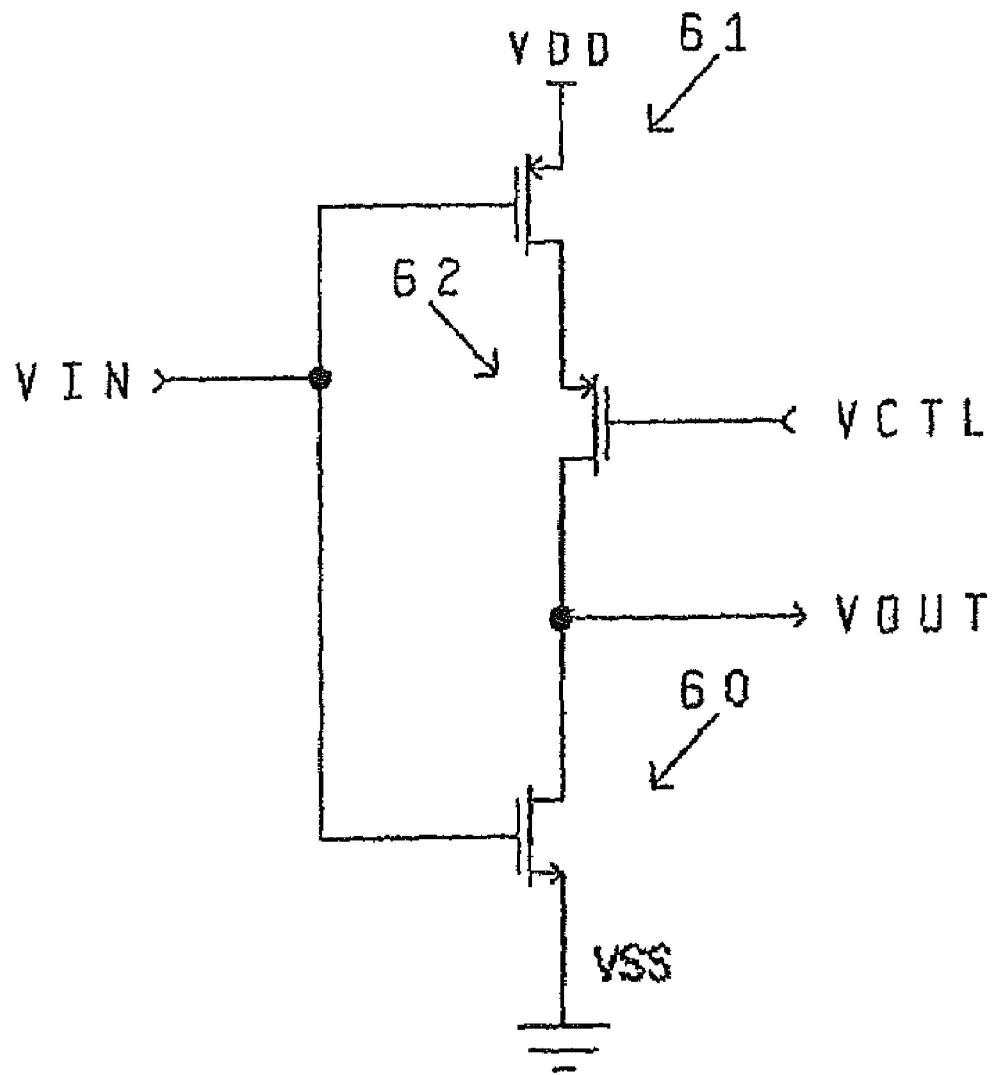
FIG. 6 shows a third embodiment of the gate driving circuit shown in FIG. 3.

FIG. 6 is a circuit diagram of a third embodiment of the gate driving circuit 31 shown in FIG. 3. According to the input signal VIN, the gate driving circuit 31 reversely outputs the gate driving signal VOUT and uses the same to drive an n-type power transistor. In this embodiment, two transistors 60, 61 constitute a main driving stage to reversely output the gate driving signal VOUT according to the input signal VIN, and another transistor 62 forms a control stage, which, according to the control signal VCTL, causes the gate driving circuit 31 to executes logic operation "AND". When the input signal VIN is logic high, the transistor 60 is in the ON state and the transistor 61 in the OFF state; and therefore, the gate driving signal VOUT is logic low, bringing the driven element to be OFF. At this point, the driven element is not subject to breakdown, and therefore, the control signal VCTL is logic low, and the gate driving circuit 31 operates normally. When the input signal VIN is logic low, the transistor 61 is in the ON state and the transistor 60 in the OFF state; and therefore, the gate driving signal VOUT turns to logic high, bringing the driven element to be turned on. When the gate driving signal VOUT has become higher than a preset level, the control signal VCTL turns to logic high, bringing the transistor 62 to be OFF, so as to turn off the gate driving circuit 31. In this manner, the gate driving circuit 31 stops charging and discharging the gate parasitic capacitor of the driven element 33 to achieve the clamping function.

Figure 7:
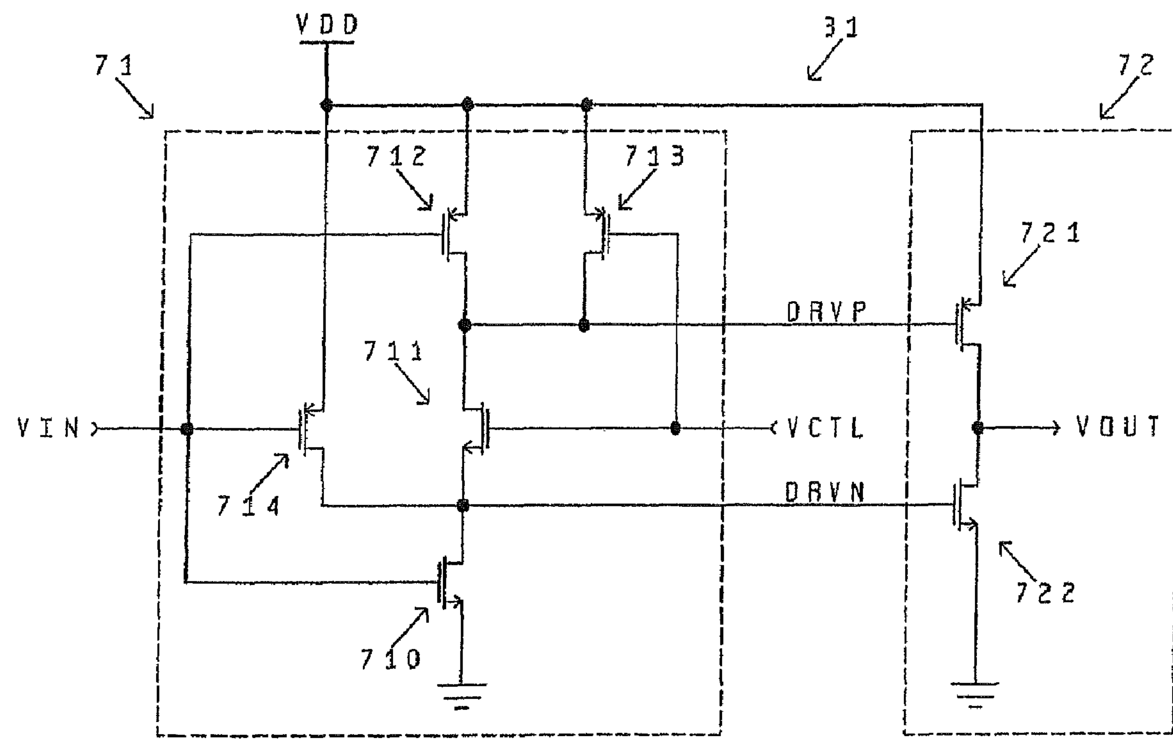
FIG. 7 shows a fourth embodiment of the gate driving circuit shown in FIG. 3.

FIG. 7 is a circuit diagram of a fourth embodiment of the gate driving circuit 31 shown in FIG. 3. According to the input signal VIN, the gate driving circuit 31 non-reversely outputs the gate driving signal VOUT and uses the same to drive an n-type power transistor. In this embodiment, a first driving circuit 71 comprises a main driving stage of transistors 710, 712, 714 and a control stage of transistors 711, 713; and a second driving circuit 72 comprises transistors 721, 722. In the second driving circuit 72, the transistor 721 receives a driving signal DRVP generated by the first driving circuit 71 and the transistor 722 receives a driving signal DRVN generated by the first driving circuit 71 to together generate the gate driving signal VOUT. When the control signal VCTL is logic high, the gate driving circuit 31 operates normally, and the driving signals DRVP, DRVN generated by the first driving circuit 71 are directly controlled by the input signal VIN to drive the second driving circuit 72. Therefore, the gate driving signal VOUT is output according to the input signal VIN. When the input signal VIN is logic low, the driving signal DRVP of the first driving circuit 71 is logic high, bringing the transistor 721 of the second driving circuit 72 to be OFF, while the driving signal DRVN of the first driving circuit 71 is directly controlled by the input signal VIN to be logic low, and the transistor 722 of the second driving circuit 72 is OFF to stop charging the second driven element from the circuit common ground VSS. In this manner, the gate driving signal VOUT can be maintained at (i.e. clamped to) a preset driving level.

The following embodiments describe the operation of the difference comparison circuit 32.

Figure 8:
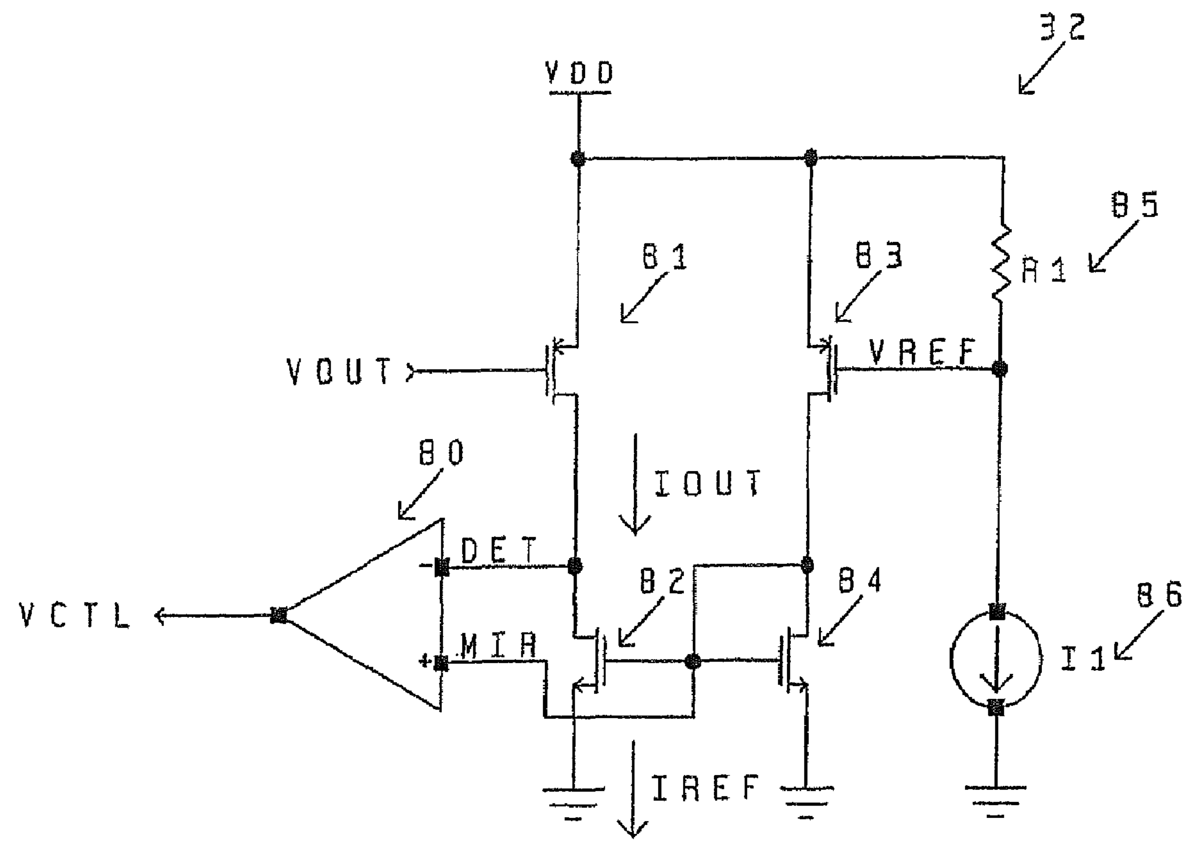
FIG. 8 shows a first embodiment of the difference comparison circuit shown in FIG. 3.

FIG. 8 is a circuit diagram showing a first embodiment of the difference comparison circuit 32 shown in FIG. 3 for controlling the driving of a p-type power transistor. In this embodiment, a transistor 81 constitutes the error amplifier 321, and the supply voltage VDD is the above-described reference voltage VPOT. Resistor 85 and current source 86 together constitute the reference voltage level VREF, which refers to the source voltage VDD. In this embodiment, the reference voltage level is as follows: VREF=VDD−I1*R1. Transistors 82, 84 constitute a current mirror and generate a reference current source IREF, which together with a transistor 83, the resistor 85, and the current source 86 to form a difference amplifier. A voltage comparator 80 constitutes the comparison circuit 322. Wherein, the voltage comparator 80 may be a conventional operational amplifier. According to the gate driving signal VOUT, the transistor 81 is turned on with an output current source IOUT. When the gate driving signal VOUT is larger than the reference voltage level VREF, the output current source IOUT is smaller than the reference current source IREF. As a result, the analog signal DET is smaller than the analog signal MIR. At this point, the control signal VCTL output by the voltage comparator 80 is logic high. When the gate driving signal VOUT is smaller than the reference voltage level VREF, the output current source IOUT is larger than the reference current source IREF. As a result, the analog signal DET is higher than the analog signal MIR. At this point, the control signal VCTL output by the voltage comparator 80 is logic low. In this embodiment, when the control signal VCTL is logic high, it controls the gate driving circuit 31 to operate normally; and when the control signal VCTL is logic low, it controls the gate driving circuit 31 to turn off.

Figure 9:
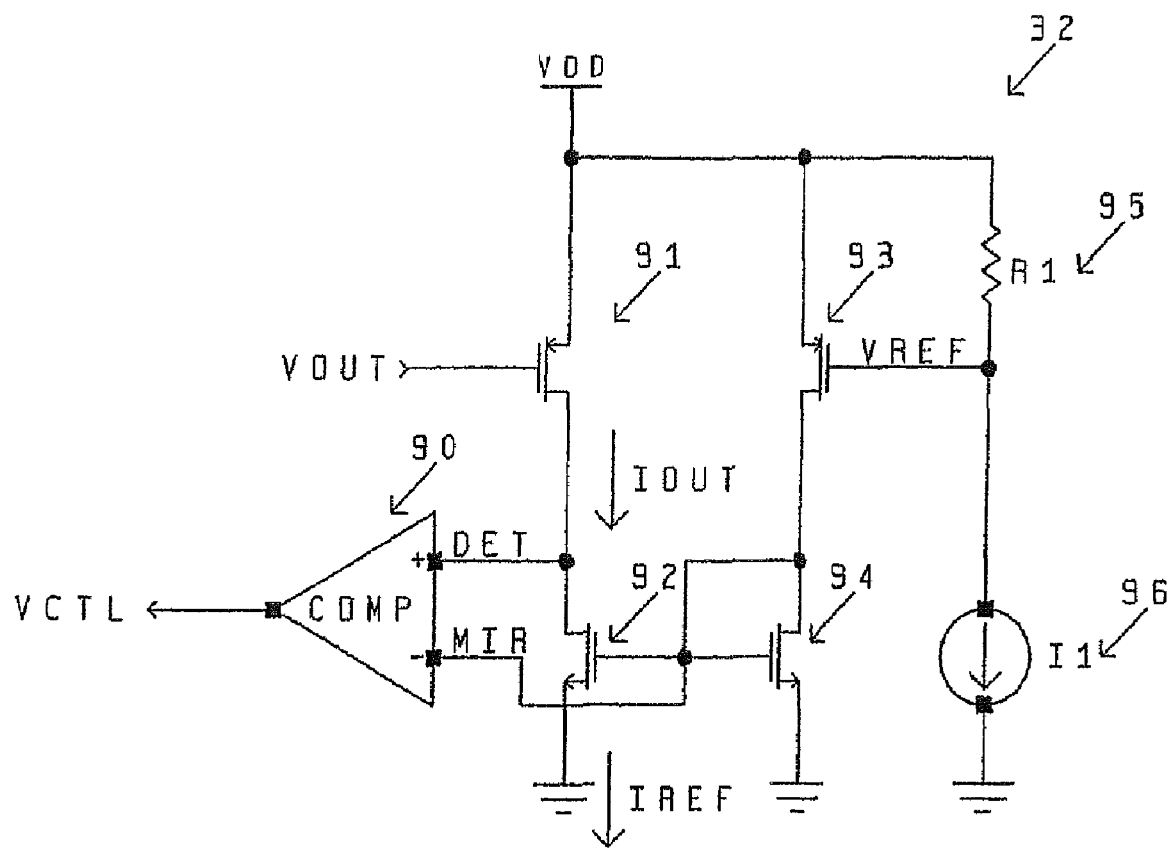
FIG. 9 shows a second embodiment of the difference comparison circuit shown in FIG. 3.

FIG. 9 is a circuit diagram showing a second embodiment of the difference comparison circuit 32 shown in FIG. 3 for controlling the driving of a p-type power transistor. In this embodiment, a transistor 91 constitutes the error amplifier 321, and the supply voltage VDD is the above-described reference voltage VPOT. Resistor 95 and current source 96 together constitute the reference voltage level VREF, which refers to the source voltage VDD. In this embodiment, the reference voltage level is as follows: VREF=VDD−I1*R1. Transistors 92, 94 constitute a current mirror, which together with a transistor 93, the resistor 95, and the current source 96 generate a reference current source IREF. A voltage comparator 90 constitutes the comparison circuit 322. Wherein, the voltage comparator 90 may be a conventional operational amplifier. According to the gate driving signal VOUT, the transistor 91 is turned on with an output current source IOUT. When the gate driving signal VOUT is larger than the reference voltage level VREF, the output current source IOUT is smaller than the reference current source IREF. As a result, the analog signal DET is smaller than the analog signal MIR. At this point, the control signal VCTL output by the voltage comparator 90 is logic low. When the gate driving signal VOUT is smaller than the reference voltage level VREF, the output current source IOUT is larger than the reference current source IREF. As a result, the analog signal DET is higher than the analog signal MIR. At this point, the control signal VCTL output by the voltage comparator 90 is logic high. In this embodiment, when the control signal VCTL is logic low, it controls the gate driving circuit 31 to operate normally; and when the control signal VCTL is logic high, it controls the gate driving circuit 31 to turn off.

Figure 10:
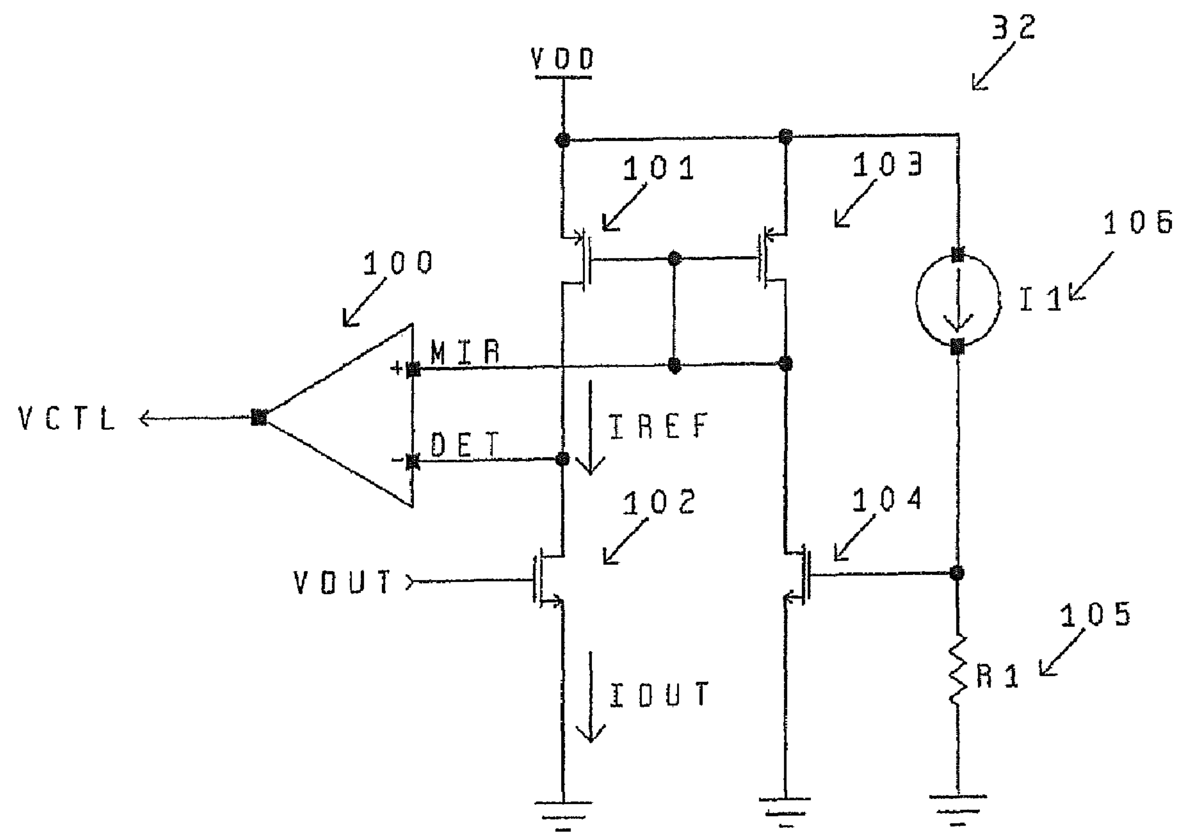
FIG. 10 shows a third embodiment of the difference comparison circuit shown in FIG. 3.

FIG. 10 is a circuit diagram showing a third embodiment of the difference comparison circuit 32 shown in FIG. 3 for controlling the driving of an n-type power transistor. In this embodiment, a transistor 102 constitutes the error amplifier 321, and the circuit common ground VSS is the above-described reference voltage VPOT. Resistor 105 and current source 106 together constitute the reference voltage level VREF, which refers to the circuit common ground VSS. In this embodiment, the reference voltage level is as follows: VREF=I1*R1. Transistors 101, 103 constitute a current mirror, which together with transistor 104, the resistor 105, and the current source 106 generate a reference current source IREF. A voltage comparator 100 constitutes the comparison circuit 322. Wherein, the voltage comparator 100 may be a conventional operational amplifier. According to the gate driving signal VOUT, the transistor 102 constitutes an output current source IOUT. When the gate driving signal VOUT is smaller than the reference voltage level VREF, the output current source IOUT is smaller than the reference current source IREF. As a result, the analog signal DET is larger than the analog signal MIR. At this point, the control signal VCTL output by the voltage comparator 100 is logic low. When the gate driving signal VOUT is larger than the reference voltage level VREF, the output current source IOUT is larger than the reference current source IREF. As a result, the analog signal DET is lower than the analog signal MIR. At this point, the control signal VCTL output by the voltage comparator 100 is logic high. In this embodiment, when the control signal VCTL is logic low, it controls the gate driving circuit 31 to operate normally; and when the control signal VCTL is logic high, it controls the gate driving circuit 31 to turn off.

Figure 11:
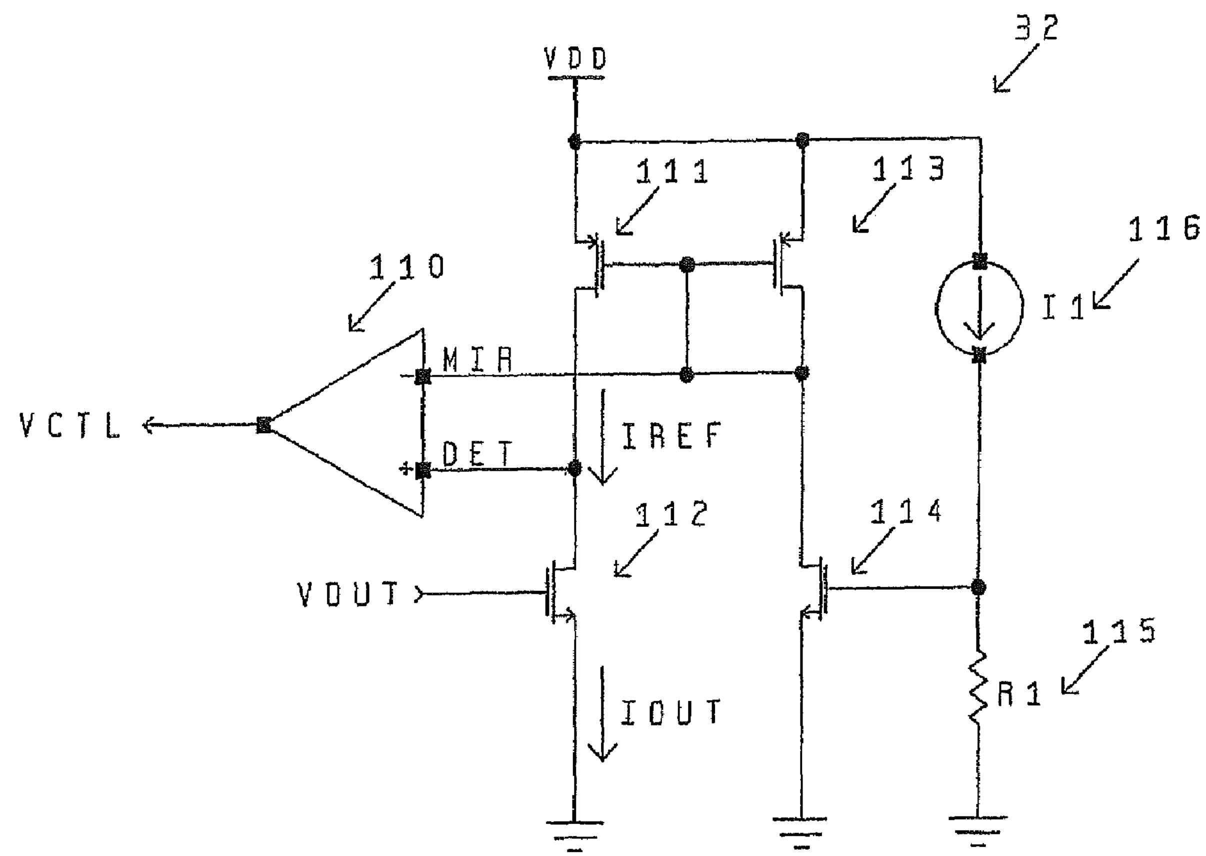
FIG. 11 shows a fourth embodiment of the difference comparison circuit shown in FIG. 3.

FIG. 11 is a circuit diagram showing a fourth embodiment of the difference comparison circuit 32 shown in FIG. 3 for controlling the driving of an n-type power transistor. In this embodiment, a transistor 112 constitutes the error amplifier 321, and the circuit common ground VSS is the above-described reference voltage VPOT. Resistor 115 and current source 116 together constitute the reference voltage level VREF, which refers to the circuit common ground VSS. In this embodiment, the reference voltage level is as follows: VREF=I1*R1. Transistors 111, 113 constitute a current mirror, which together with a transistor 114, the resistor 115, and the current source 116 generate a reference current source IREF. A voltage comparator 110 constitutes the comparison circuit 322. Wherein, the voltage comparator 110 may be a conventional operational amplifier. According to the gate driving signal VOUT, the transistor 112 constitutes an output current source IOUT. When the gate driving signal VOUT is smaller than the reference voltage level VREF, the output current source IOUT is smaller than the reference current source IREF. As a result, the analog signal DET is larger than the analog signal MIR. At this point, the control signal VCTL output by the voltage comparator 110 is logic high. When the gate driving signal VOUT is larger than the reference voltage level VREF, the output current source IOUT is larger than the reference current source IREF. As a result, the analog signal DET is lower than the analog signal MIR. At this point, the control signal VCTL output by the voltage comparator 110 is logic low. In this embodiment, when the control signal VCTL is logic high, it controls the gate driving circuit 31 to operate normally; and when the control signal VCTL is logic low, it controls the gate driving circuit 31 to turn off.

Figure 12:
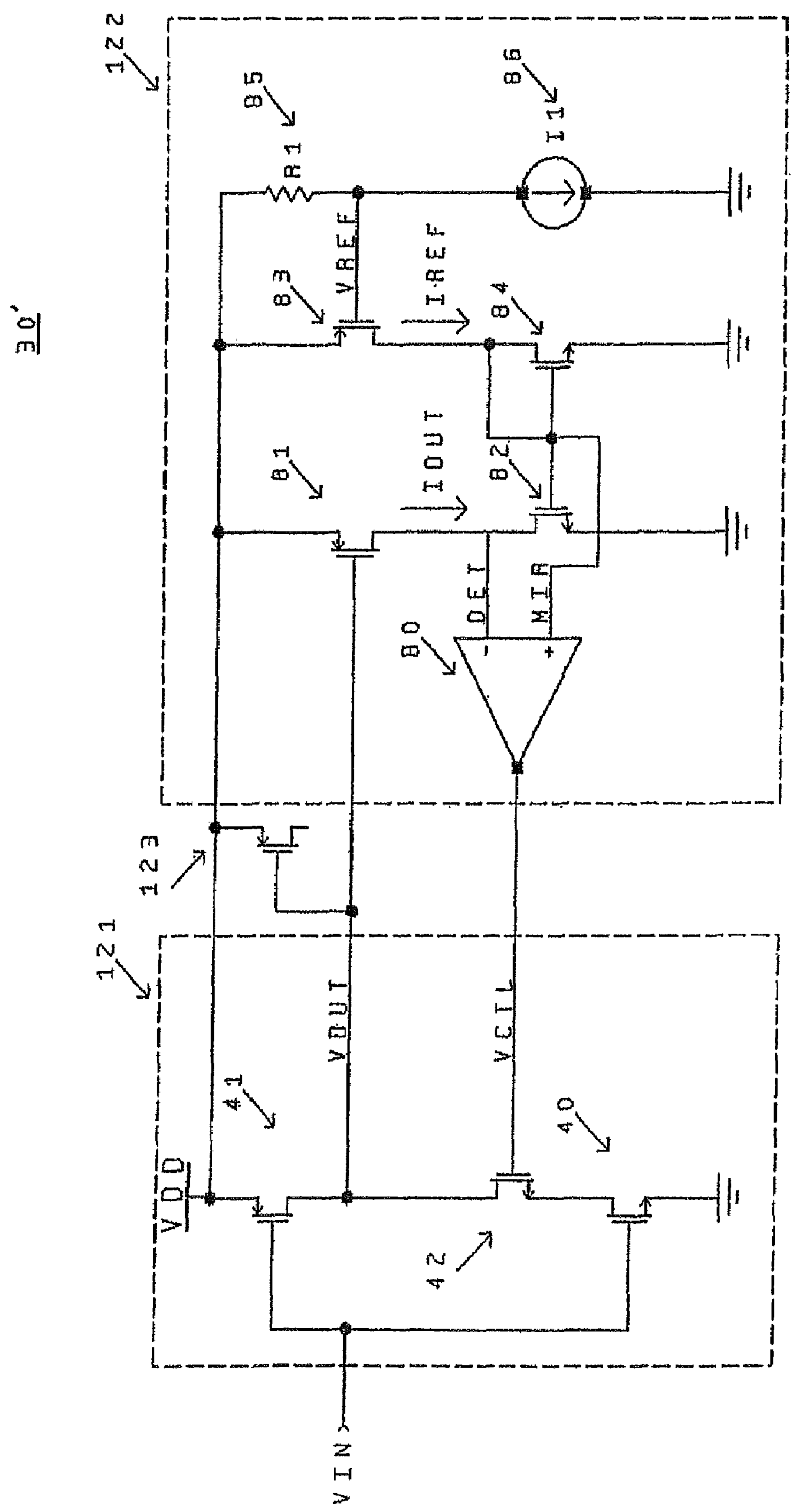
FIG. 12 is a detailed circuit diagram showing a first embodiment of the active voltage-clamping gate driving circuit of the present invention applied in driving a p-type power transistor.

FIG. 12 is a detailed circuit diagram showing a first embodiment of the active voltage-clamping gate driving circuit 30' of the present invention applied in driving a p-type power transistor 123. The active voltage-clamping gate driving circuit 30' includes a gate driving circuit 121, as shown in FIG. 4, and a difference comparison circuit 122, as that shown in FIG. 8. When the input signal VIN is logic low, the transistor 41 of the gate driving circuit 121 is in the ON state, and the transistor 40 is in the OFF state. As a result, the gate driving signal VOUT is logic high. That is, the driven element 123 is charged from the circuit common ground. A voltage level of the gate driving signal VOUT is close to the supply voltage VDD, so that the control signal VCTL output by the difference comparison circuit 122 is logic high, and the transistor 42 is ON. When the input signal VIN is turned to be logic high, the transistor 41 of the gate driving circuit 121 is in the OFF state, and the transistors 40, 42 are in the ON state. As a result, the gate driving signal VOUT is turned to be logic low. That is, the driven element 123 is discharged to the circuit common ground. When a voltage level of the gate driving signal VOUT become lower than the reference voltage level VREF, the control signal VCTL output by the difference comparison circuit 122 is turned to be logic low, and the transistor 42 of the gate driving circuit 121 is OFF. At this point, the gate driving circuit 121 stops discharging the driven element 123 to the circuit common ground, so that the voltage level of the gate driving signal VOUT does not change any further. Therefore, the gate driving signal VOUT is clamped, and there is not quiescent direct current when the gate driving signal VOUT is clamped.

Figure 13:
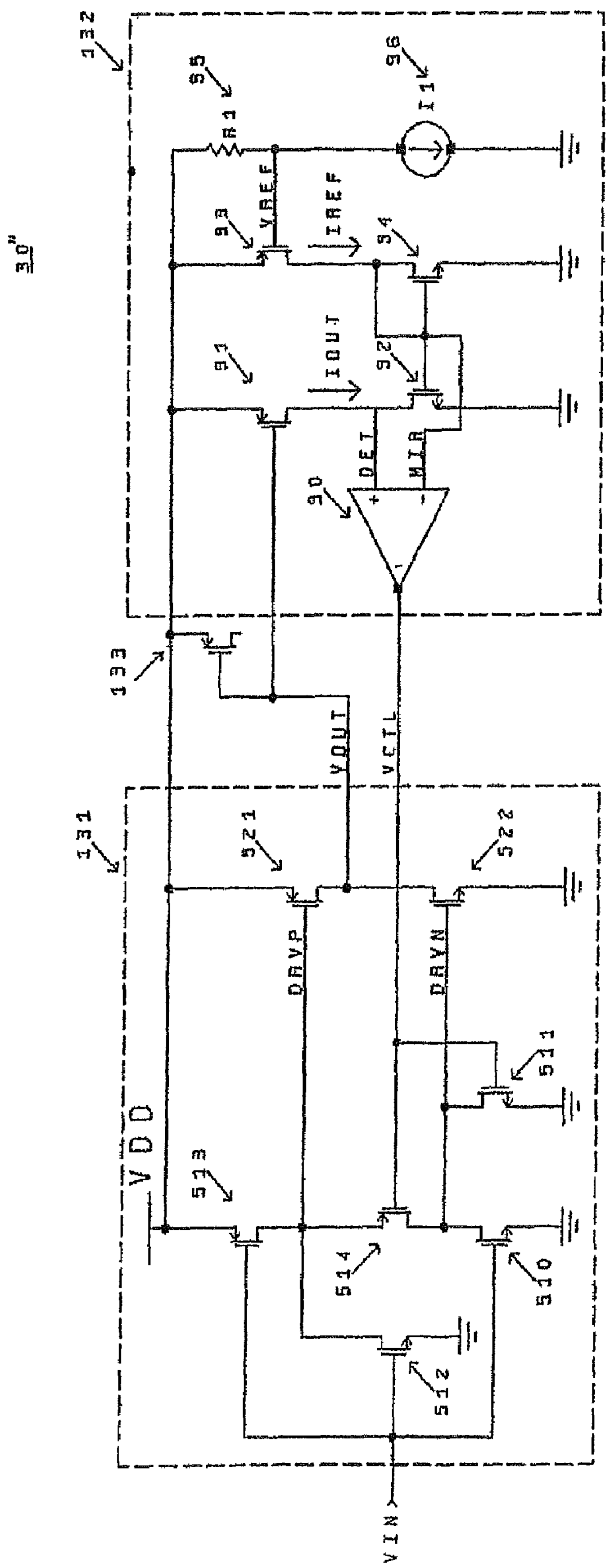
FIG. 13 is a detailed circuit diagram showing a second embodiment of the active voltage-clamping gate driving circuit of the present invention applied in driving a p-type power transistor.

FIG. 13 is a detailed circuit diagram showing a second embodiment of the active voltage-clamping gate driving circuit 30" of the present invention applied in driving a p-type power transistor 133. The active voltage-clamping gate driving circuit 30" includes a gate driving circuit 131, as shown in FIG. 5, and a difference comparison circuit 132, as shown in FIG. 9. When the input signal VIN becomes logic high, transistors 510, 512, 514, 521 of the gate driving circuit 131 are in the ON state, and transistors 511, 513, 522 are in the OFF state. As a result, the gate driving signal VOUT is logic high. That is, the driven element 133 is charged from the circuit common ground. A voltage level of the gate driving signal VOUT is close to the supply voltage VDD, so that the control signal VCTL output by the difference comparison circuit 132 is logic low. When the input signal VIN becomes logic low, transistors 513, 514, 522 of the gate driving circuit 131 are in the ON state, and transistors 510, 511, 512, 521 are in the OFF state. As a result, the gate driving signal VOUT is turned to be logic low. That is, the driven element 133 is discharged to the circuit common ground. When a voltage level of the gate driving signal VOUT becomes lower than the reference voltage level VREF, the control signal VCTL output by the difference comparison circuit 132 is turned to be logic high, bringing the transistor 514.of the gate driving circuit 131 to be OFF and the transistor 511 to be ON, so that the transistor 522 is also OFF. At this point, the gate driving circuit 131 stops charging the driven element 133 from the circuit common ground, so that the gate driving signal VOUT does not change any further. Therefore, the gate driving signal VOUT is clamped, and there is not quiescent direct current when the gate driving signal VOUT is clamped.

Figure 14:
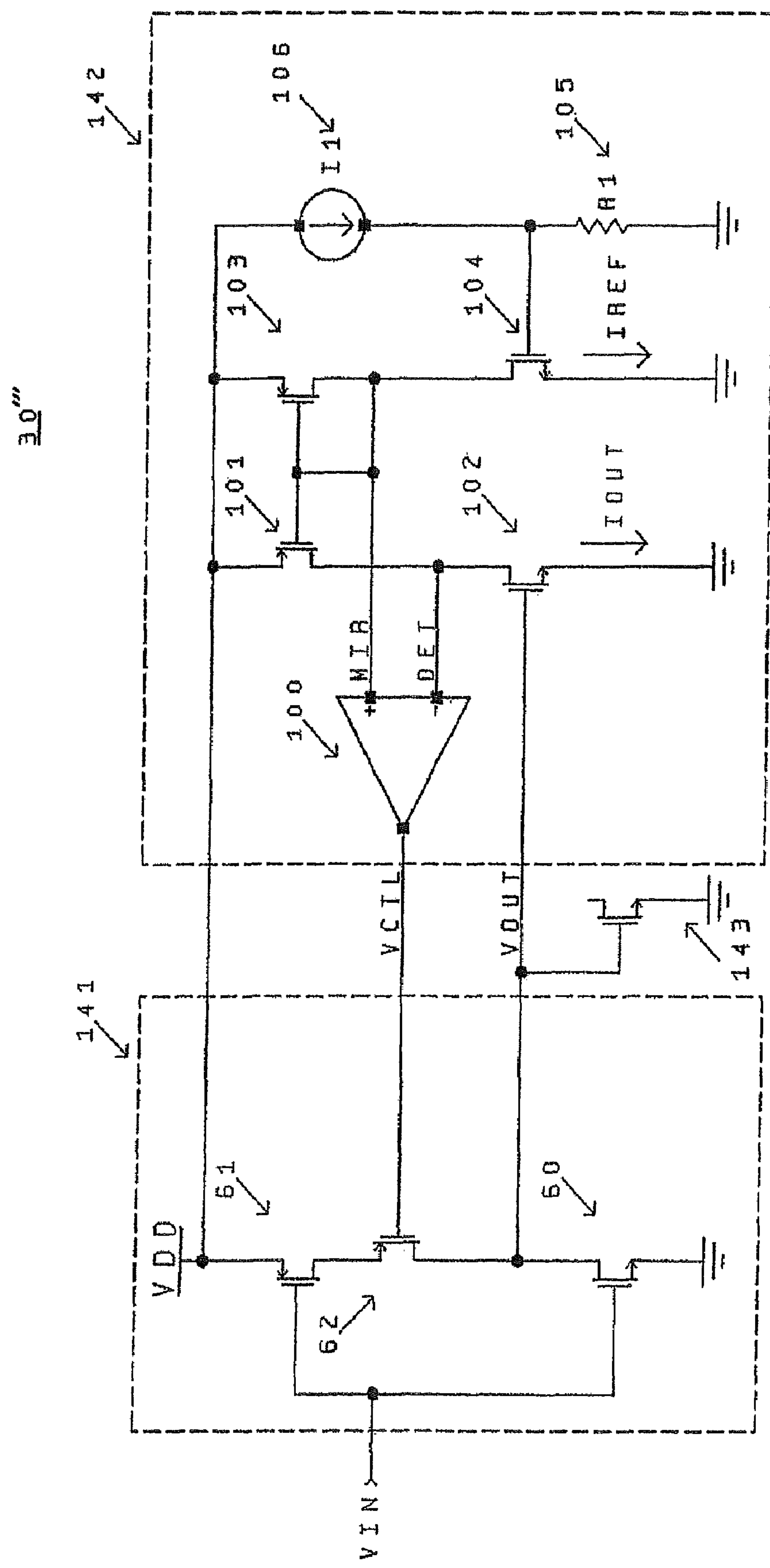
FIG. 14 is a detailed circuit diagram showing a first embodiment of the active voltage-clamping gate driving circuit of the present invention applied in driving an n-type power transistor.

FIG. 14 is a detailed circuit diagram showing a first embodiment of the active voltage-clamping gate driving circuit 30''' of the present invention applied in driving an n-type power transistor 143. The active voltage-clamping gate driving circuit 30''' includes a gate driving circuit 141, as shown in FIG. 6, and a difference comparison circuit 142, as shown in FIG. 10. When the input signal VIN is logic high, the transistor 60 of the gate driving circuit 141 is in the ON state, and the transistor 61 is in the OFF state. As a result, the gate driving signal VOUT is logic low. That is, the driven element 143 is discharged to the circuit common ground. A voltage level of the gate driving signal VOUT is close to the circuit common ground VSS, so that the control signal VCTL output by the difference comparison circuit 142 is logic low, and the transistor 62 is ON. When the input signal VIN becomes logic low, the transistor 60 of the gate driving circuit 141 is in the OFF state, and transistors 61, 62 are in the ON state. As a result, the gate driving signal VOUT is turned to be logic high. That is, the driven element 143 is charged from the circuit common ground. When a voltage level of the gate driving signal VOUT is increased to the reference voltage level VREF, the control signal VCTL output by the difference comparison circuit 142 is turned to be logic high, bringing the transistor 62 of the gate driving circuit 141 to be OFF. At this point, the gate driving circuit 141 stops charging the driven element 143 from the circuit common ground, so that the gate driving signal VOUT does not change any further. Therefore, the gate driving signal VOUT is clamped, and there is not quiescent direct current when the gate driving signal VOUT is clamped.

Figure 15:
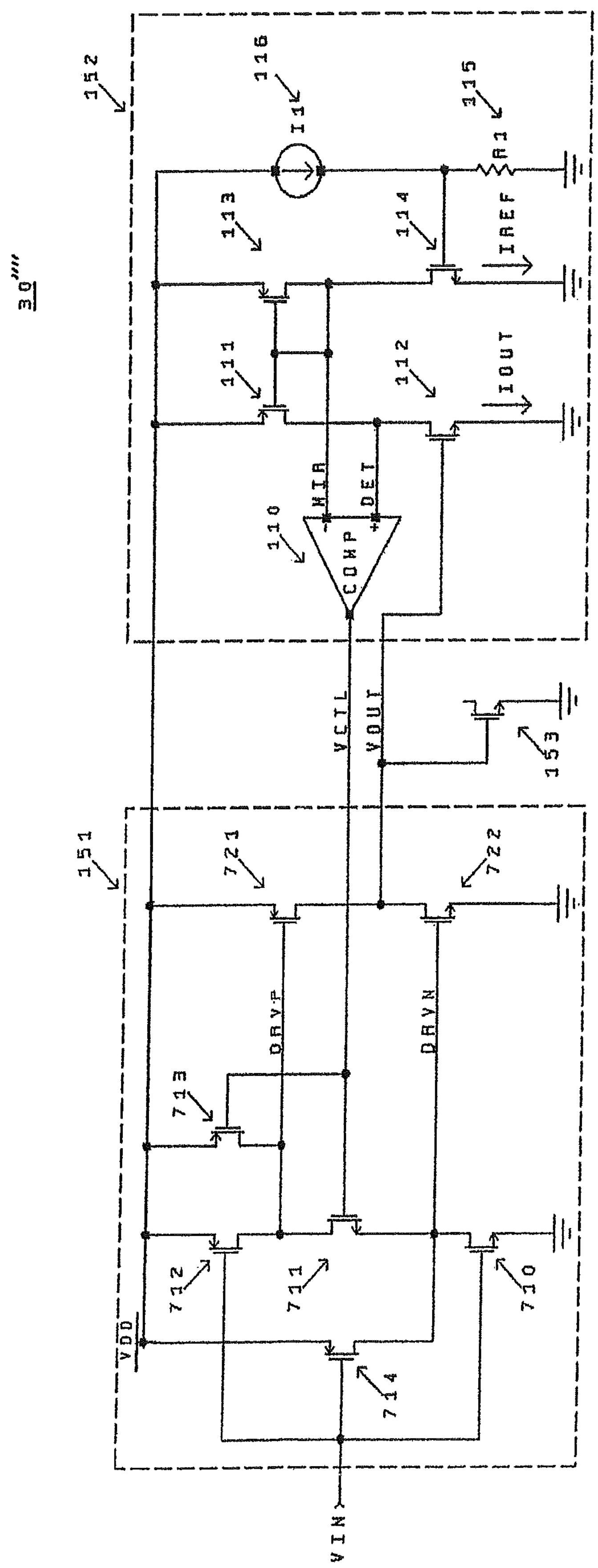
FIG. 15 is a detailed circuit diagram showing a second embodiment of the active voltage-clamping gate driving circuit of the present invention applied in driving an n-type power transistor.

FIG. 15 is a detailed circuit diagram showing a second embodiment of the active voltage-clamping gate driving circuit 30'''' of the present invention applied in driving an n-type power transistor 153. The active voltage-clamping gate driving circuit 30'''' includes a gate driving circuit 151, as shown in FIG. 7, and a difference comparison circuit 152, as shown in FIG. 11. When the input signal VIN is logic low, transistors 711, 712, 714, 722 of the gate driving circuit 151 are in the ON state, and transistors 710, 713, 721 are in the OFF state. As a result, the gate driving signal VOUT is logic low. That is, the driven element 153 is discharged to the circuit common ground. A voltage level of the gate driving signal VOUT is close to the circuit common ground VSS, so that the control signal VCTL output by the difference comparison circuit 152 is logic high. And, when the input signal VIN becomes logic high, transistors 710, 711, 721 of the gate driving circuit 151 is in the ON state, and transistors 712, 713, 714, 722 are in the OFF state. As a result, the gate driving signal VOUT is turned to be logic high. That is, the driven element 153 is charged from the circuit common ground. When a voltage level of the gate driving signal VOUT is increased to the reference voltage level VREF, the control signal VCTL output by the difference comparison circuit 152 is turned to be logic low, bringing the transistor 711 of the gate driving circuit 151 to be OFF and the transistor 713 to be ON, so that the transistor 721 is OFF. At this point, the gate driving circuit 151 stops charging the driven element 153 from the circuit common ground, so that the gate driving signal VOUT does not change any further. Therefore, the gate driving signal VOUT is clamped, and there is not quiescent direct current when the gate driving signal VOUT is clamped.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An active voltage-clamping gate driving circuit, comprising:

a difference comparison circuit for receiving a reference voltage and a gate driving signal, and outputting a gate control signal according to the received reference voltage and gate driving signal; and a gate driving circuit for receiving an input signal and the gate control signal output by the difference comparison circuit, and outputting the gate driving signal;

wherein, when a level difference between the gate driving signal and the reference voltage is substantially equal to a preset value, the gate control signal controls the gate driving circuit to turn off, so that the gate driving signal level is clamped to a preset voltage level;

further wherein the difference comparison circuit further receives an adjustable preset reference level voltage, so as to determine whether the level difference between the gate driving signal and the reference voltage is substantially equal to the preset reference level voltage.

2. The active voltage-clamping gate driving circuit as claimed in claim 1, wherein the gate driving circuit includes:

a first transistor comprising a first gate, a first drain, and a first source; the first gate receiving the input signal, and the first source being coupled to a circuit common ground;

a second transistor comprising a second gate, a second drain, and a second source; the second gate receiving the input signal, and the second source being coupled to a supply voltage; and a third transistor comprising a third gate, a third drain, and a third source; the third gate receiving the gate control signal, the third source being coupled to one of the first drain and the second drain and the third drain being coupled to the other one of the first drain and the second drain, and the third drain generating the gate driving signal.

3. The active voltage-clamping gate driving circuit as claimed in claim 1, wherein the gate driving circuit includes:

a fourth transistor comprising a fourth gate, a fourth drain, and a fourth source; the fourth gate receiving the input signal, and the fourth source being coupled to a circuit common ground;

a fifth transistor comprising a fifth gate, a fifth drain, and a fifth source; the fifth gate receiving the gate control signal, the fifth source being coupled to the circuit common ground, and the fifth drain being coupled to the fourth drain;

a sixth transistor comprising a sixth gate, a sixth drain, and a sixth source; the sixth gate receiving the input signal, and the sixth source being connected to the circuit common ground;

a seventh transistor comprising a seventh gate, a seventh drain, and a seventh source; the seventh gate receiving the input signal, and the seventh source being connected to a supply voltage, the seventh drain being coupled to the sixth drain;

an eighth transistor comprising an eighth gate, an eighth drain, and an eighth source; the eighth gate receiving the gate control signal, the eighth source being coupled to the seventh drain, and the eighth drain being coupled to the fourth drain;

a ninth transistor comprising a ninth gate, a ninth drain, and a ninth source; the ninth gate being coupled to the seventh drain, the ninth source being connected to the supply voltage, and the ninth drain outputting the gate driving signal; and a tenth transistor comprising a tenth gate, a tenth drain, and a tenth source; the tenth gate being coupled to the fourth drain, the tenth source being connected to the circuit common ground, and the tenth drain being coupled to the ninth drain.

4. The active voltage-clamping gate driving circuit as claimed in claim 1, wherein the gate driving circuit includes:

an eleventh transistor comprising an eleventh gate, an eleventh drain, and an eleventh source; the eleventh gate receiving the input signal, and the eleventh source being connected to a circuit common ground;

a twelfth transistor comprising a twelfth gate, a twelfth drain, and a twelfth source; the twelfth gate receiving the input signal, and the twelfth source being connected to a supply voltage;

a thirteenth transistor comprising a thirteenth gate, a thirteenth drain, and a thirteenth source; the thirteenth gate receiving the gate control signal, the thirteenth source being connected to the supply voltage, and the thirteenth drain being coupled to the twelfth drain;

a fourteenth transistor comprising a fourteenth gate, a fourteenth drain, and a fourteenth source; the fourteenth gate receiving the input signal, the fourteenth source being connected to the supply voltage, and the fourteenth drain being connected to the eleventh drain;

a fifteenth transistor comprising a fifteenth gate, a fifteenth drain, and a fifteenth source;

the fifteenth gate receiving the gate control signal, the fifteenth source being coupled to the eleventh drain, and the fifteenth drain being coupled to the twelfth drain;

a sixteenth transistor comprising a sixteenth gate, a sixteenth drain, and a sixteenth source; the sixteenth gate being coupled to the thirteenth drain, the sixteenth source being connected to the supply voltage, and the sixteenth drain outputting the gate driving signal; and a seventeenth transistor comprising a seventeenth gate, a seventeenth drain, and a seventeenth source; the seventeenth gate being coupled to the eleventh drain, the seventeenth source being connected to the circuit common ground, and the seventeenth drain being coupled to the sixteenth drain.

5. The active voltage-clamping gate driving circuit as claimed in claim 1, wherein the difference comparison circuit includes:

an error amplifier for generating a voltage difference signal according to the supply reference voltage and the gate driving signal; and a comparison circuit for generating the gate control signal for controlling the gate driving circuit according to the preset reference level and the voltage difference signal.

6. The active voltage-clamping gate driving circuit as claimed in claim 5, wherein the difference comparison circuit includes:

an eighteenth transistor comprising an eighteenth gate, an eighteenth drain, and an eighteenth source; the eighteenth gate receiving the gate driving signal, the eighteenth source being connected to a supply voltage, and the eighteenth drain being coupled to the comparison circuit.

7. The active voltage-clamping gate driving circuit as claimed in claim 6, wherein the comparison circuit includes:

a first reference current source connected to a circuit common ground;

a first reference resistor connected to the supply voltage and the first reference current source to generate the preset voltage level;

a nineteenth transistor comprising a nineteenth gate, a nineteenth drain, and a nineteenth source; the nineteenth source being connected to a circuit common ground, and the nineteenth drain being coupled to the eighteenth drain;

a twentieth transistor comprising a twentieth gate, a twentieth drain, and a twentieth source; the twentieth gate being connected to a coupling point of the first reference current source and the first reference resistor, and the twentieth source being connected to the supply voltage;

a 21$^{st}$ transistor comprising a 21$^{st}$ gate, a 21$^{st}$ drain, and a 21$^{st}$ source; the 21$^{st}$ gate being coupled to the 21$^{st}$ drain and the nineteenth gate, the 21$^{st}$ drain being coupled to the twentieth drain, and the 21$^{st}$ source being connected to the circuit common ground; and a first voltage comparator having a first positive terminal, a first negative terminal, and a first output; the first positive terminal being coupled to one of the nineteenth gate and the eighteenth drain and the first negative terminal being coupled to the other one of the nineteenth gate and the eighteenth gate, and the first output outputting the gate control signal.

8. The active voltage-clamping gate driving circuit as claimed in claim 5, wherein the error amplifier includes:

a 22$^{nd}$ transistor comprising a 22$^{nd}$ gate, a 22$^{nd}$ drain, and a 22$^{nd}$ source; the 22$^{nd}$ gate receiving the gate driving signal, the 22$^{nd}$ source being connected to a circuit common ground, and the 22$^{nd}$ drain being coupled to the comparison circuit.

9. The active voltage-clamping gate driving circuit as claimed in claim 8, wherein the comparison circuit includes:

a second reference current source being connected to a supply voltage;

a second reference resistor being connected to the circuit common ground and the second reference current source to generate the preset voltage level;

a 23$^{rd}$ transistor comprising a 23$^{rd}$ gate, a 23$^{rd}$ drain, and a 23$^{rd}$ source; the 23$^{rd}$ source being connected to the supply voltage, and the 23$^{rd}$ drain being coupled to the 22$^{nd}$ drain;

a 24$^{th}$ transistor comprising a 24$^{th}$ gate, a 24$^{th}$ drain, and a 24$^{th}$ source; the 24$^{th}$ gate being coupled to the 24$^{th}$ drain and 23$^{rd}$ gate, and the 24$^{th}$ source being connected to the supply voltage;

a 25$^{th}$ transistor comprising a 25$^{th}$ gate, a 25$^{th}$ drain, and a 25$^{th}$ source; the 25$^{th}$ gate being connected to a coupling point of the second reference current source and the second reference resistor, the 25$^{th}$ source being connected to the circuit common ground, and the 25$^{th}$ drain being coupled to the 24$^{th}$ drain; and a second voltage comparator including a second positive terminal, a second negative terminal, and a second output; the second positive terminal being coupled to one of the 24$^{th}$ gate and the 22$^{nd}$ drain and the second negative terminal being coupled the other one of the 24$^{th}$ gate and the 22$^{nd}$ drain, and the second output outputting the gate control signal.

10. The active voltage-clamping gate driving circuit as claimed in claim 1 wherein:

the gate driving circuit is turned off when a difference between the gate driving signal and the reference voltage is larger than the preset voltage level, so that the gate driving signal level is clamped and a voltage difference between the gate driving signal and the reference voltage being substantially equal to the preset voltage level.

11. The active voltage-clamping gate driving circuit as claimed in claim 1, wherein the preset voltage level is generated according to a supply voltage, a circuit common ground, or a voltage level of the source/drain of a transistor driven by the active voltage-clamping gate driving circuit.

12. The active voltage-clamping gate driving circuit as claimed in claim 1, wherein:

the gate driving circuit is turned off when a difference between the gate driving signal and the reference voltage is smaller than the preset voltage level, so that the gate driving signal level is clamped and a voltage difference between the gate driving signal and the reference voltage being substantially equal to the preset voltage level.

13. An active voltage-clamping gate driving circuit, comprising:

a difference comparison circuit including:

an error amplifier for receiving a reference voltage and a gate driving signal and generating a voltage difference signal according to the received reference voltage and gate driving signal; and a comparison circuit for receiving the voltage difference signal and a preset reference level voltage, the comparison circuit generating a gate control signal according to the preset reference level and the voltage difference signal;

a gate driving circuit for receiving an input signal and the gate control signal output by the difference comparison circuit, and outputting the gate driving signal;

wherein, when a level difference between the gate driving signal and the reference voltage is substantially equal to the preset reference level voltage, the gate control signal controls the gate driving circuit to turn off, so that the gate driving signal level is clamped and a voltage difference between the gate driving signal and the reference voltage being substantially equal to a preset voltage level.

* * * * *